United States Patent [19]
Azami

[11] Patent Number: 6,096,600
[45] Date of Patent: Aug. 1, 2000

[54] METHOD OF FORMING A CAPACITATIVE SECTION OF A SEMICONDUCTOR DEVICE AND METHOD OF FORMING A CAPACITATIVE SECTION AND GATE SECTION OF A SEMICONDUCTOR DEVICE

[75] Inventor: Junko Azami, Tokyo, Japan

[73] Assignee: Oki Electric Industry Co., Ltd., Tokyo, Japan

[21] Appl. No.: 09/038,691

[22] Filed: Mar. 9, 1998

[30] Foreign Application Priority Data

Oct. 1, 1997 [JP] Japan .................................... 9-268948

[51] Int. Cl.$^7$ ............................................. H01L 21/8242
[52] U.S. Cl. ......................... 438/250; 438/251; 438/649; 438/253
[58] Field of Search ..................... 438/250–256, 438/393–399, 648–686

[56] References Cited

U.S. PATENT DOCUMENTS 5,618,749  4/1997  Takahashi et al. .
5,631,188  5/1997  Chang et al. .

*Primary Examiner*—Jey Tsai
*Attorney, Agent, or Firm*—Jones Volentines, LLP

[57] ABSTRACT

The phosphorus concentration of an upper electrode and the phosphorus concentration of a lower electrode can be made equally high without loss of adhesion between the polysilicon and a metallic layer. It includes a step of forming a stacked layer structure consisting of: a lower electrode layer provided on an underlay, a dielectric layer provided on this lower electrode layer, and an upper electrode layer consisting of an impurity-doped layer and a metallic layer successively provided on this dielectric layer, and a step of doping the metallic layer with the same impurity as the impurity in the impurity-doped layer prior to heat treatment of the stacked layer structure.

19 Claims, 5 Drawing Sheets

METHOD OF FORMING A CAPACITATIVE SECTION OF A SEMICONDUCTOR DEVICE AND METHOD OF FORMING A CAPACITATIVE SECTION AND GATE SECTION OF A SEMICONDUCTOR DEVICE

BACKGROUND OF THE INVENTION

1. Field of the Invention

The present invention relates to a method of manufacturing a semiconductor device, in particular, a semiconductor device wherein a capacitative section and transistor section are provided on the same substrate.

2. Description of the Related Art

Previously, semiconductor devices in which capacitative sections and transistor sections were provided on the same substrate, for example capacitative section peripheral portions of devices used in CMOS logic ICs were manufactured by a method as below. A brief description is given below with reference to FIG. 7.

First of all, the upper surface of substrate 101 is oxidised to form a thin $SiO_2$ film (not shown); an active region 107 is then produced by forming a thick field oxide film 105 to effect element isolation. The thin $SiO_2$ film on substrate 101 is then removed (FIG. 7(A)).

Next, a thin $SiO_2$ film 103 is formed by again oxidising the upper surface of substrate 101. On this $SiO_2$ film 103 and on field oxide film 105, a polycrystalline Si layer 109 (lower electrode polysilicon film) for the lower electrode of the capacitative section is deposited, and a dielectric film 111 is formed on this lower electrode polysilicon layer 109. Next, a mask 113 is formed corresponding to the shape of the lower electrode of the capacitative section (FIG. 7(B)).

Using this mask 113, photolithography and subsequent etching processing are performed, so as to leave behind only the polysilicon 109a and dielectric film 11a in the region on field oxide film 105 where the capacitative section is subsequently to be formed (FIG. 7(C)).

At this point, the thin $SiO_2$ film 103 is also removed. Gate oxide film 115a is then formed on active region 107 by again performing oxidation. Also, oxide film 115b is formed on the side face of lower electrode polysilicon 109a. Next, a polysilicon layer 117 for the gate electrode and upper electrode is deposited on the entire upper surface of this structure and furthermore a $WSi_x$ layer 119 (tungsten silicide) is deposited on this polysilicon layer 117. This polysilicon layer 117 and $WSi_x$ layer 119 (x indicates the composition ratio and has a value in the range 2.2<x<2.5) are of gate electrode material, or the material of the upper electrode of the capacitative section could also be used. After this, a resist pattern 121 of the shape of the upper electrode and gate electrode is formed on $WSi_x$ 119 (FIG. 7(D)).

By performing photolithography and etching, an upper electrode layer 123 consisting of part 117a of polysilicon 117 and part 119a of $WSi_x$ 119 is formed on dielectric film 111a, and a gate electrode 125 consisting of part 117b of the polysilicon and part 119b of the $WSi_x$ is formed on gate oxide film 115a (FIG. 7(E))

As described above, the upper electrode of the capacitative section is constituted by polysilicon and tungsten silicide. It is desirable that the concentration of the phosphorus, which is an impurity in the polysilicon of the upper electrode and lower electrode of the capacitative section, should be the same, but if the upper electrode is formed of the same material in the same step as the gate electrode of the transistor, the polysilicon of the upper electrode contains phosphorus in a concentration of for example $4\times10^{20}$ ion/$cm^3$. In contrast, the polysilicon of the lower electrode contains phosphorus in a concentration of $6\times10^{20}$ ion/$cm^3$, so there is a difference in the phosphorus concentrations. Furthermore, the phosphorus that is contained in the polysilicon of this upper electrode diffuses into the tungsten silicide under subsequent heat treatment. This therefore further reduces the phosphorus concentration in the polysilicon of the upper electrode, increasing the difference in concentration of silicon between the upper electrode and lower electrode.

As a result, with the dispersion of phosphorus ions ($P^+$) into the $WSi_x$, electron migration takes place, turning the vicinity of the interface between the dielectric film and lower electrode into a depletion layer. This therefore gives rise to the problem of change in the capacitance of the capacitative section dependent on voltage.

It is therefore necessary to eliminate the difference in phosphorus concentration of the upper electrode and lower electrode by raising the phosphorus concentration in the upper electrode of the capacitative section.

Accordingly, the method has of course been considered of, when forming the upper electrode, forming this using a material wherein the phosphorus concentration of the polysilicon is raised beforehand and then depositing the tungsten silicide; however, it has been confirmed by experiment etc. that, if this is done, adhesion between the polysilicon and tungsten silicide is poor.

Realisation of a method of forming a capacitative section of a semiconductor device whereby the phosphorus concentration of the upper electrode could be raised to the same level as the phosphorus concentration of the lower electrode without loss of adhesion between the polysilicon and tungsten silicide was therefore desired.

SUMMARY OF THE INVENTION

Accordingly, according to a first aspect of the present invention, there is provided a method of forming a capacitative section of a semiconductor device comprising: a step of forming a stacked layer structure consisting of a lower electrode layer provided on an underlay, a dielectric layer provided on this lower electrode layer, an impurity-doped layer provided successively on this dielectric layer, and an upper electrode layer consisting of a metallic layer; and a step of doping the metallic layer with the same impurity as the impurity in the impurity-doped layer, prior to heat treatment of the stacked layer structure.

By raising the impurity concentration of the metallic layer by doping the metallic layer with impurity, impurity is diffused also into the impurity doped layer therebelow, raising its impurity concentration. An equilibrium condition of the impurity concentration is thereby obtained between the metallic layer and impurity-doped layer. Diffusion of impurity into the metallic layer from the impurity-doped layer when heat treatment is performed in subsequent steps can therefore be prevented. A difference in impurity concentration between the lower electrode layer and upper electrode layer therefore cannot arise. Consequently, a desirable capacity characteristic of the capacitative section is obtained which does not depend on voltage. Also, since the doping of impurity into this metallic layer is effected after formation of the metallic layer on the impurity-doped layer, there is no possibility of adhesion between the impurity-doped layer and metallic layer being impaired.

Also, the step of forming a stacked layer structure may preferably include a first step of forming an island-shaped lower electrode layer and dielectric layer on the underlay and a second step of forming an impurity-doped layer covering the dielectric layer on the underlay and forming a metallic layer on this impurity-doped layer.

The structure on which the second step has been performed is a stacked layer structure wherein an island-shaped lower electrode layer and dielectric layer are formed in a capacitative section region on an underlay and an impurity-doped layer and, on top of this, a metallic layer are formed on the underlay such as to cover this dielectric layer. Subsequently in the impurity doping step impurity is introduced from above the metal using for example the ion implantation method. Impurity can be prevented from doping the underlay since the region apart from the capacitative section region of the underlay is covered by the impurity-doped layer. There is therefore no risk of adverse effect on the underlay due to impurity if for example other elements such as transistors are formed in the region outside the capacitative section region of the underlay. Also, if this capacitative section is formed as the capacitative section of a CMOS Logic IC, an MOS transistor may be formed on the underlay where this capacitative section is formed. If a structure as described above is employed, the upper electrode of the capacitative section and the gate electrode of the transistor can easily be formed in the same photolithography/etching step.

Also, doping of the metallic layer of this stacked layer structure can be performed on the entire upper surface of this metallic layer.

There is no risk that the underlay region outside the capacitative section will thereby be contaminated with impurity.

Also, the doping of the metallic layer of this stacked layer structure can be performed in respect of regions of the upper surface of this metallic layer positioned directly above the island-shaped lower electrode layer and dielectric layer.

For example, doping of the impurity may be performed by forming a resist pattern whose apertures are regions positioned directly above the lower electrode layer and dielectric layer on the upper face of the metallic layer.

In this way, since impurity is introduced exclusively to the portions of the metallic layer that will subsequently constitute the upper electrode, a gate electrode can be formed on the underlay using another portion of the metallic layer and impurity-doped layer. Since this gate electrode is unaffected by impurity, there is no possibility of the transistor characteristic being changed.

Preferably, the dielectric layer is an $SiO_2$ layer, the lower electrode layer and impurity doped layer are polysilicon layers, the metallic layer is a tungsten silicide layer, and the impurity may be phosphorus.

Also, according to a second aspect of the present invention, there is provided a method of forming a capacitative section and gate section of a semiconductor device including: a step of forming a stacked layer structure consisting of a lower electrode layer provided on an underlay, a dielectric layer provided on this lower electrode layer, and an upper electrode layer consisting of a first impurity doped layer and first metallic layer successively provided on this dielectric layer, and a gate electrode consisting of an island-shaped second impurity doped layer and second metallic layer provided on the underlay and separated from this stacked layer structure; and a step of doping the first metallic layer with the same impurity as in the first impurity-doped layer, prior to heat treatment in respect of the stacked structure.

The first and second impurity doped layers and the first and second metallic layers are respectively formed of the same material and by the same step. Specifically, the upper electrode layer of the capacitative section and the gate electrode of the transistor section are constituted by the same material and are formed by the same step. Doping of impurity into the first metallic layer of such a stacked layer structure may be performed using for example the method of ion implantation of impurity from above the stacked layer structure.

Preferably also, in order to avoid the effect of impurity on the underlay region and/or gate electrode, a resist pattern (also called a mask) is formed that apertures a region of the first metallic layer of the stacked structure, and doping of impurity may then be performed by ion implantation from above the resist pattern.

Also, preferably, doping of impurity is performed in the underlay region surrounding the first metallic layer and gate electrode.

By this means, the production of a difference in impurity concentration between the upper electrode and lower electrode of the capacitative section is eliminated. Also, an LDD structure can be formed in the transistor section by doping of impurity into the underlay region around the gate electrode. At this point, for example, impurity is injected by ion implantation using a resist pattern whose aperture exposes a region of the transistor section and upper surface of the first metallic layer. As a result, introduction of impurity into the first metallic layer and introduction of impurity into the underlay region for forming an LDD structure can be performed in the same step.

Also preferably, the step of doping impurity may be a step including a step (1) of forming a protective layer on the underlay so as to cover the stacked layer structure and gate electrode and levelling the upper surface of this protective layer, and a step (2) of ion implantation of impurity from the upper surface of the protective layer towards the underlay.

Comparing the distance from the upper surface of the levelled protective layer to the upper surface of the first metallic layer with the distance from the upper surface of the protective layer to the upper surface of the gate electrode, the distance in the case of a stacked layer structure having a stacked layer construction is shorter than in the case of a gate electrode. Consequently, if ion implantation of impurity is performed from the upper side of the protective layer towards the underlay, the impurity is first introduced into the first metallic layer. If ion implantation is performed with low energy that is insufficient to pass through the thickness of the protective layer from the upper surface of the protective layer to the gate electrode, the first metallic layer can be selectively doped with impurity. Consequently, the risk of impurity affecting the gate electrode and/or underlay region can be avoided by a simple step.

Also, preferably, the lower electrode layer, first impurity doped layer and second impurity doped layer are polysilicon layers, the dielectric layer is an $SiO_2$ layer, the first metallic layer and second metallic layer are tungsten silicide layers, and the impurity is phosphorus.

BRIEF DESCRIPTION OF THE DRAWINGS

The foregoing and other objects, features and advantages of the present invention will be better understood from the following description taken in connection with accompanying drawings, in which FIG. 1, including

DESCRIPTION OF THE PREFERRED EMBODIMENTS

Figure 1A:
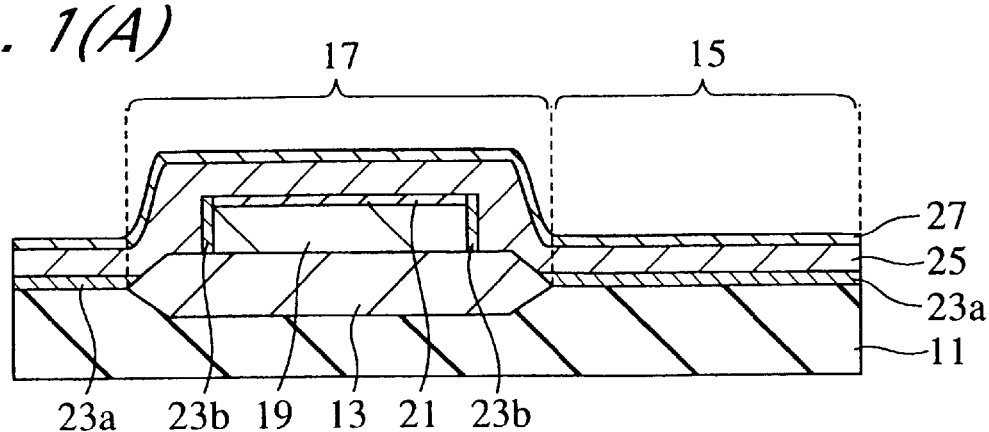
FIGS. 1(A)–1(C), is a process cross-sectional view given for purposes of explanation of a first embodiment of a method of forming the peripheral structure of a capacitative section of a semiconductor device according to the present invention.

Embodiments of the present invention are described below with reference to the drawings. It should be noted that the drawings are only shown diagrammatically to the extent necessary to enable the invention to be understood; the invention is therefore not restricted to the examples shown in the drawings. Also, in order to facilitate understanding of the drawings, some of the hatching for indication of cross-sections is not shown.

First Embodiment

As a first embodiment, there is described with reference to FIG. 1 an example in which an island-shaped lower electrode layer and dielectric layer are formed on an underlay and an impurity-doped layer is formed on the underlay so as to cover this lower electrode layer and dielectric layer, a stacked layer structure being formed by providing a metallic layer on top of this impurity-doped layer, doping of impurity then being carried out over the entire upper surface of the metallic layer of this stacked layer structure.

FIG. 1 is a diagrammatic cross-sectional view showing the process of formation of the structure around a capacitative section of a semiconductor device according to this embodiment.

First of all, using the same method as that previously carried out, isolation or element separation is effected by forming a thick field oxide film 13 after forming a thin $SiO_2$ film by oxidising the upper surface of substrate 11. This field oxide film 13 is formed such that its thickness from the upper surface of substrate 11 is for example 1000–1300 Å (0.10–0.13 $\mu$m). After this, the $SiO_2$ film is temporarily removed and a thin $SiO_2$ film is again formed by oxidising the upper surface of substrate 11. Active region 15 is now designated as a transistor region and the region above field oxide film 13 is designated as a capacitative section region 17. This construction constitutes the underlay. Next, on the upper surface of this underlay there is deposited a first polysilicon (Poly-Si) layer (wherein the concentration of phosphorus impurity is 6× $10^{20}$ ion/cm$^3$) constituting a lower electrode layer covering the $SiO_2$ film and field oxide film 13, in for example a thickness of 3000 Å (0.3 $\mu$m), and a dielectric layer is provided on this first polysilicon layer. In this case the dielectric layer is an $SiO_2$ layer, of thickness 400 Å (40 nm). Next, island-shaped lower electrode layer 19 and dielectric layer 21 are formed by carrying out photolithography and subsequent etching processing, leaving behind, only in capacitative section region 17, a portion 19 of the first polysilicon layer and a portion 21 of the $SiO_2$ layer, and removing the polysilicon and $SiO_2$ layers and thin $SiO_2$ film in other regions. Preferably, this etching is performed by dry etching. Gate oxide film 23a is formed in the transistor region 15 by oxidative treatment of this structure. Also by this treatment, an oxide film 23b is formed on the side walls of lower electrode layer 19. After this, over the entire upper surface of substrate 11, a second polysilicon layer of thickness for example 1500 Å (0.15 $\mu$m) is deposited, containing phosphorus in a concentration of $4\times10^{20}$ ion/cm$^3$ to constitute impurity-doped layer 25, and, further, on top of this, there is provided a metallic layer 27 constituted by a tungsten silicide ($WSi_x$) layer of thickness 1000 Å (0.10 $\mu$m). The symbol x is the composition ratio and normally has a value in the range 2.2<x<2.5. The stacked layer structure of capacitative section region 17 of the semiconductor device is thereby formed (FIG. 1(A)).

Figure 1B:
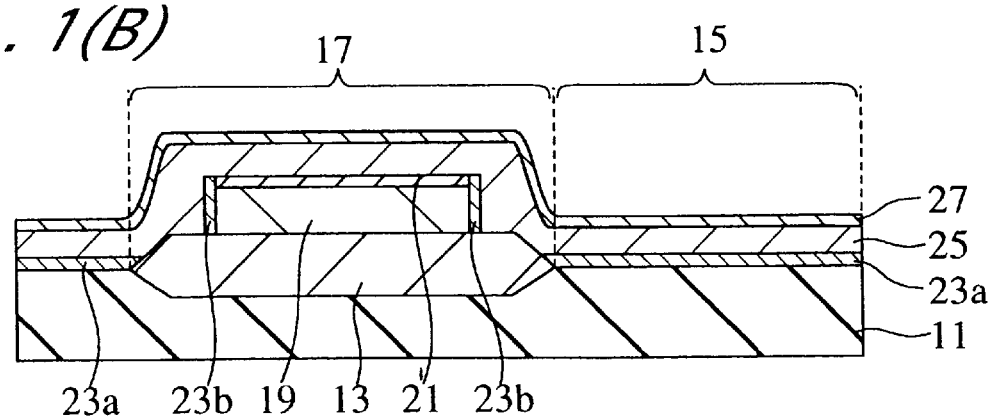
Figure 1C:
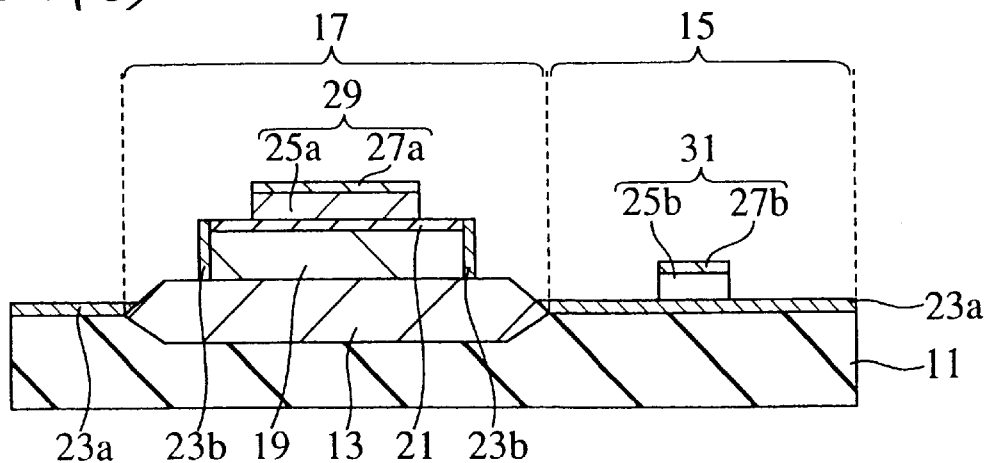

The entire upper surface of the $WSi_x$ layer 27 of this stacked layer structure is then doped by ion implantation of phosphorus (P) (FIG. 1(B)). This doping is suitably conducted in a low-energy range of accelerating energy 20–40 keV, providing a dose of $1\times10^{16}$ ion/cm$^2$.

After this, by performing photolithography and etching treatment, an island-shaped second polysilicon layer 25a and $WSi_x$ layer 27a are formed on the island-shaped dielectric layer 21. An upper electrode layer 29 is constituted by $WSi_x$ layer 27a and second polysilicon layer 25a that are left behind by this etching, which is carried out by dry etching. Also, island-shaped second polysilicon layer 25b and $WSi_x$ layer 27b are formed on gate oxide film 23a of transistor region 15 likewise using a photolithography/etching step. This second polysilicon layer 25b and $WSi_x$ layer 27b constitute gate electrode 31. Consequently, the thickness of this gate electrode 31 is the same as upper electrode layer 29 at 2500 Å (0.25 $\mu$m) (since the thickness of second polysilicon layer 25a is 1500 Å and the thickness of $WSi_x$ layer 27a is 1000 Å). The construction thus obtained is shown in cross-section in FIG. 1(C).

A capacitative section of a semiconductor device can thereby be formed. Also, a gate section of a transistor section can be concurrently formed.

With a capacitative section of a semiconductor device formed according to this embodiment, since doping is performed also into second polysilicon layer 25a by doping $WSi_x$ layer 27 with phosphorus, even though a subsequent heat treatment step is performed, the phosphorus concentration in the second polysilicon layer 25a can be made about as high as that in the lower electrode layer 19 (i.e. $6\times10^{20}$ ion/cm$^3$). Also, diffusion of phosphorus from the second polysilicon layer 25a into $WSi_x$ layer 27a constituting upper electrode 29 is eliminated. Consequently, the difference in concentration between the lower electrode layer 19 and upper electrode layer 29 is eliminated, and the change of capacitance of the capacitative section with voltage that is caused by this difference in phosphorus concentration can also therefore be eliminated.

Also, since, when phosphorus doping is effected, substrate 11 is covered by second polysilicon layer 25 and $WSi_x$ layer 27, direct doping of phosphorus thereinto cannot occur. Consequently, there is no risk of the transistor characteristics being affected by introduction of phosphorus into substrate 11.

Second Embodiment

As a second embodiment, there is described with reference to FIG. 2 an example in which the phosphorus doping to a metallic layer of the stacked layer structure described in the first embodiment is performed in respect of the region of the upper surface of the metallic layer which is positioned directly above the island-shaped lower electrode layer and dielectric layer.

Figure 2:
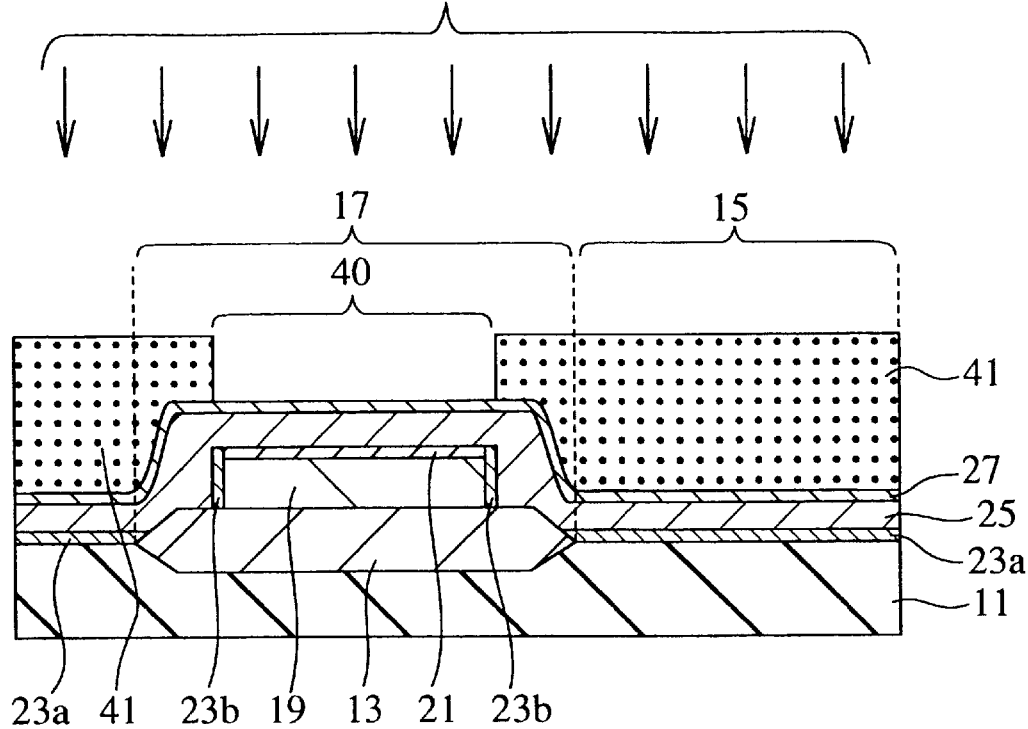
FIG. 2 is a cross-sectional view given in explanation of a second embodiment of a method of forming according to the present invention.

FIG. 2 is a cross-sectional view illustrating diagrammatically a construction during a process of forming the vicinity of the capacitative section of a semiconductor device according to this embodiment.

Hereinbelow, the differences from the first embodiment are described and detailed description of aspects which are the same as in the first embodiment is omitted.

In the same way as in the first embodiment, a stacked layer structure is formed by forming on capacitative section region 17 of substrate 11 island-shaped layer electrode layer 19 constituting a first polysilicon layer and dielectric layer 21 constituting an $SiO_2$ layer, forming an impurity-doped layer 25 constituting a second polysilicon layer on the entire upper surface of substrate 11 so as to cover this lower electrode layer 19 and dielectric layer 21, and providing on this second polysilicon layer 25 a metallic layer 27 constituted by a tungsten silicide layer ($WSi_x$ layer). The symbol x is the composition ratio and is a value in the range $2.2 < x < 2.5$).

After this, a resist is applied on to $WSi_x$ layer 27 and a resist pattern 41 is formed that apertures a region positioned directly above island-shaped dielectric layer 21. This aperture is shown at 40 in FIG. 2. After this, ion implantation (see FIG. 2) is performed on the upper surface of $WSi_x$ layer 27 from the top of this resist pattern 41. In this process, doping with phosphorus ions is effected under the conditions: acceleration energy of 20–40 keV and dose of $1 \times 10^{16}$ ion/cm².

After this, using the photolithography/etching step as in the case of the first embodiment, the second polysilicon layer and $WSi_x$ layer are formed in island shape on island-shaped dielectric layer 21 to constitute the upper electrode layer. Also, a gate electrode constituted by an island-shaped second polysilicon layer and $WSi_x$ layer is formed on the gate oxide film of the transistor region in the same step.

By this means, the capacitative section of the transistor device and the gate electrode of the transistor section can be formed concurrently.

Also, as in the first embodiment, in the capacitative section of the semiconductor device that is formed in this embodiment, the phosphorus concentration in the second polysilicon layer can be made high and diffusion of phosphorus from the second polysilicon layer into the $WSi_x$ layer constituting the upper electrode layer is eliminated in spite of the subsequent heat treatment step. The difference in phosphorus concentration between the lower electrode layer and upper electrode layer is thereby eliminated. As a result, change with voltage of the capacitance of the capacitative section caused by difference in the phosphorus concentration is also eliminated.

Also, doping of phosphorus only takes place into the region of the $WSi_x$ layer positioned directly above the island-shaped dielectric layer. Consequently, there is no possibility of the substrate that is covered by the first polysilicon layer and $WSi_x$ layer being doped by phosphorus and furthermore phosphorus is not introduced into the second polysilicon layer and $WSi_x$ layer portion constituting the gate electrode. The risk of the transistor characteristic fluctuating due to raised phosphorus concentration of the gate electrode caused by phosphorus doping can thereby be avoided.

Third Embodiment

A third embodiment will now be described with reference to FIG. 3, in which a stacked layer structure is formed by providing on an underlay a lower electrode layer and, on top of this lower electrode layer, a dielectric layer, and providing on this dielectric layer, in sequence, a first impurity-doped layer and first metallic layer constituting an upper electrode layer; a gate electrode consisting of an island-shaped second impurity-doped layer and second metallic layer is formed simultaneously with this stacked layer structure on the underlay, separated from this stacked layer structure; and the same impurity as the impurity in the first impurity-doped layer is doped into the first metallic layer prior to heat treatment of the stacked layer structure.

Figure 3:
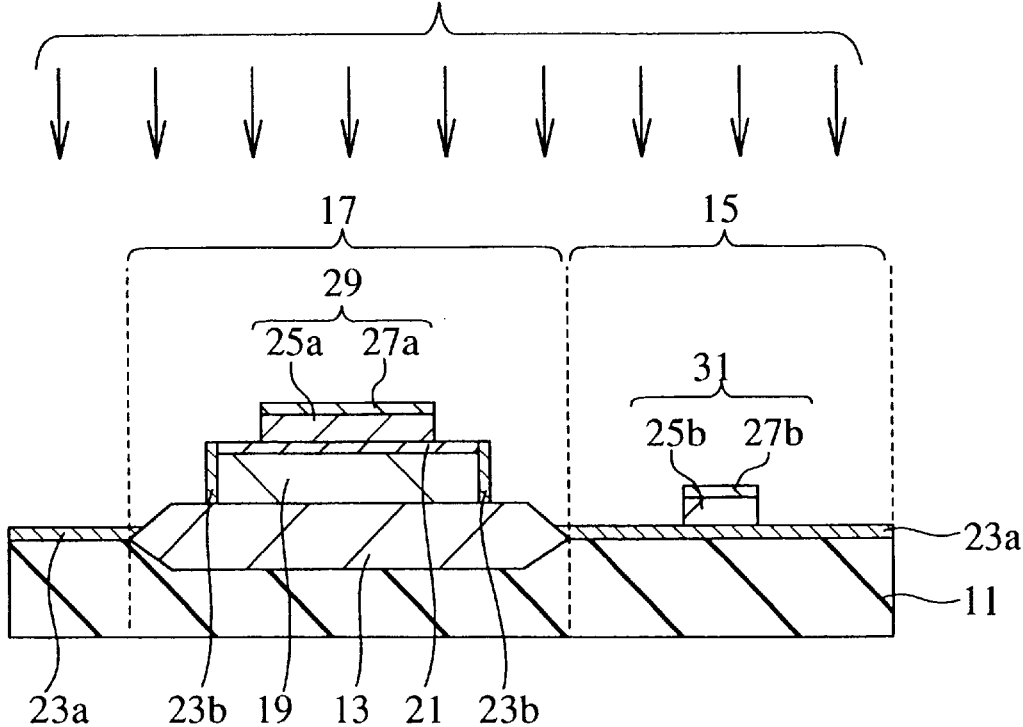
FIG. 3 is a cross-sectional view given in explanation of a third embodiment of a method of forming according to the present invention.

FIG. 3 is a diagrammatic cross-sectional view of a construction during the process of forming the vicinity of a capacitative section of a semiconductor device according to this embodiment.

Hereinbelow, those aspects which are different from the first and second embodiments are described but detailed description of aspects which are the same as in the case of the first and second embodiments is omitted.

In the same way as in the first embodiment, a stacked layer structure is formed by forming on capacitative section region 17 of substrate 11 an island-shaped lower electrode layer 19 constituting a first polysilicon layer (phosphorus concentration $6 \times 10^{20}$ ion/cm³) and a dielectric layer 21 constituting an $SiO_2$ layer, forming, as an impurity-doped layer 25 on the entire upper surface of the substrate 11 so as to cover this lower electrode layer 19 and dielectric layer 21 a second polysilicon layer containing phosphorus impurity in a concentration of $4 \times 10^{20}$ ion/cm³, and providing, on this second polysilicon layer 25, a metallic layer 27 constituted by a tungsten silicide layer ($WSi_x$ layer). The symbol x is the composition ratio and is a value in the range $2.2 < x < 2.5$.

After this, using a photolithography/etching step, an upper electrode layer 29 is constituted on island-shaped dielectric layer 21 by forming, in island shape, a second polysilicon layer 25a and $WSi_x$ layer 27a. Also, likewise by a photolithography/etching step, on gate oxide film 23a of transistor region 15, there is formed a gate electrode 31 consisting of an island-shaped second polysilicon layer 25b and $WSi_x$ layer 27b. For the second impurity-doped layer, a second polysilicon layer is employed and, for the second metallic layer a tungsten silicide layer ($WSi_x$ layer) is employed.

Next, from above this upper electrode layer 29 i.e. above $WSi_x$ layer 27a, doping of phosphorus into $WSi_x$ layer 27a is performed (see FIG. 3) using the ion implantation method. Preferably this ion implantation is performed with acceleration energy of 20–40 keV and with a dose of $1 \times 10^{16}$ ion/cm².

By this means, phosphorus can be introduced from $WSi_x$ layer 27a also into second polysilicon layer 25a, and the concentration of phosphorus ions in this second polysilicon layer 25a can be raised to the same concentration as in lower electrode layer 19. Also, with upper electrode layer 29, even though subsequent heat treatment is performed, diffusion of phosphorus from second polysilicon layer 25a into $WSi_x$ layer 27a is eliminated and the production of a difference of phosphorus concentration between upper electrode layer 29 and lower electrode layer 19 is thereby eliminated.

Also, if, in anticipation of phosphorus diffusion, phosphorus is introduced beforehand into the second polysilicon layer, adhesion between the $WSi_x$ layer and the polysilicon layer containing a high concentration of phosphorus becomes poor. In this embodiment, phosphorus is doped into the WSi$_x$ layer after providing the WSi$_x$ layer on the second polysilicon layer. Consequently, diffusion of phosphorus from the second polysilicon layer into the WSi$_x$ layer can be prevented without adverse effect on the adhesion between the second polysilicon layer and WSi$_x$ layer.

Fourth Embodiment

A fourth embodiment is described with reference to FIG. 4 for an example in which doping of phosphorus into a metallic layer of a stacked layer structure as described in the third embodiment is performed for a region in the upper surface of the metallic layer positioned directly above the island-shaped lower electrode layer and dielectric layer.

Figure 4:
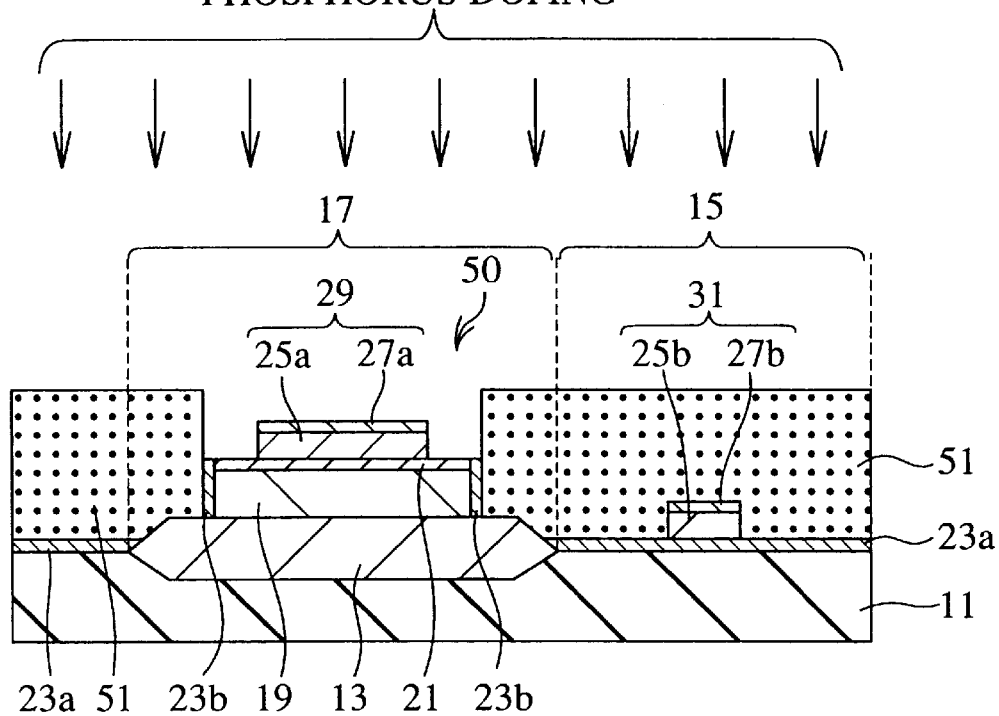
FIG. 4 is a cross-sectional view given in explanation of a fourth embodiment of a method of forming according to the present invention.

FIG. 4 shows diagrammatically a cross-section of a construction during the process of forming the vicinity of the capacitative section of a semiconductor device according to this embodiment.

Hereinbelow, aspects which are different from the first, second and third embodiments are described, but a detailed description of aspects which are the same is omitted.

Just as in the first embodiment, on capacitative section region 17 of substrate 11 there are formed a lower electrode layer 19 constituting a first polysilicon layer and a dielectric layer 21 constituting an SiO$_2$ layer; over the entire upper surface of substrate 11, a second polysilicon layer is formed, constituting an impurity doped layer 25 such as to cover this lower electrode layer 19 and dielectric layer 21, and on this second polysilicon layer 25 there is formed a metallic layer 27 constituted by a tungsten silicide layer (WSi$_x$ layer). The symbol x is the composition ratio and has a value in the range 2.2<x<2.5: a stacked layer structure is thereby formed. (See FIG. 1(A)).

After this, in the same way as in the third embodiment, using a photolithography/etching step, an upper electrode layer 29 (see FIG. 3) is constituted by forming a second polysilicon layer 25a and WSi$_x$ layer 27a on an island-shaped dielectric layer 21. Also, in the same photolithography/etching step, there is formed a gate electrode 31 consisting of island-shaped second polysilicon layer 25b and WSi$_x$ layer 27b on gate oxide film 23a of transistor region 15 (see FIG. 3).

After this, a resist pattern 51 is formed by applying resist such as to cover capacitative section region 17 and transistor section region 15 over the entire surface of substrate 11, exposing at least the upper surface of island-shaped WSi$_x$ layer 27a (see FIG. 4). The aperture for this exposure is shown at 50 in FIG. 4. Then, using this resist pattern 51 as a mask for ion implantation, phosphorus is doped on to the upper surface of WSi$_x$ layer 27a from above this mask 51 (see FIG. 4). Preferably, these phosphorus ions are injected with an acceleration energy of 20–40 keV and a dose of $1 \times 10^{16}$ ion/cm$^2$.

As a result, implantation of phosphorus can be confined to the WSi$_x$ layer 27a of upper electrode 29 and the second polysilicon layer 25a below this WSi$_x$ layer 27a. Adverse effect on the characteristics etc. of the transistor by introduction of phosphorus into other regions can thus be eliminated.

Also, even though subsequent heat treatment is performed on this construction, there is no risk of production of a difference of phosphorus concentration between upper electrode layer 29 and lower electrode layer 19. Consequently, a desired capacitative section can be formed.

Also, since phosphorus cannot be introduced into the WSi$_x$ layer 27b and second polysilicon layer 25b constituting the gate electrode 31 of the transistor section, there is no risk of fluctuation of the transistor characteristics caused by this gate electrode 31.

Fifth Embodiment

A fifth embodiment is described with reference to FIG. 5 for an example in which phosphorus doping into the metallic layer of a stacked layer structure is performed in respect of a region in the upper surface of the metallic layer positioned directly above an island-shaped lower electrode layer and dielectric as described in the fourth embodiment and, in addition, in the same step, phosphorus impurity doping is performed into the substrate peripheral to the gate electrode of the transistor region.

Figure 5:
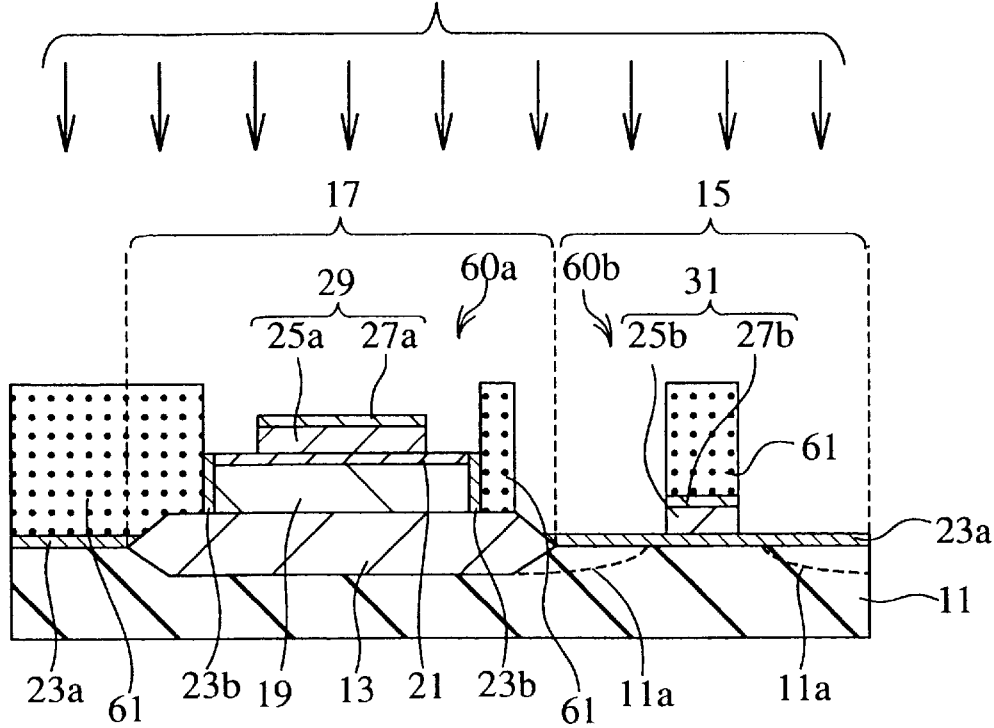
FIG. 5 is a cross-sectional view given in explanation of a fifth embodiment of a method of forming according to the present invention.

FIG. 5 is a diagrammatic cross-sectional view of a construction during the process of forming the vicinity of a capacitative section of a semiconductor device according to this embodiment.

Aspects which differ from the first, second, third and fourth embodiment are described below, but detailed description of aspects which are the same is omitted.

Just as in the case of the first embodiment, a stacked layer structure is formed by forming on capacitative section region 17 of substrate 11 an island-shaped lower electrode layer 19 constituting a first polysilicon layer (phosphorus concentration $6 \times 10^{20}$ ion/cm$^3$) and a dielectric layer 21 constituting an SiO$_2$ layer, forming on the entire upper surface of substrate 11 so as to cover this lower electrode layer 19 and dielectric layer 21 an impurity-doped layer 25 constituting a second polysilicon layer containing phosphorus in a concentration of $4 \times 10^{20}$ ion/cm$^3$, and providing on this second polysilicon layer 25 a metallic layer 27 constituted by a tungsten silicide layer (WSi$_x$ layer) (see FIG. 1(A))

After this, in the same way as in the third embodiment, using a photolithography/etching step, on island-shaped dielectric layer 21, there are formed in island shape a second polysilicon layer 25a and WSi$_x$ layer 27a, to constitute upper electrode layer 29. Also, in the same photolithography/etching step, there is formed a gate electrode 31 consisting of island-shaped second polysilicon layer 25b and WSi$_x$ layer 27b on the gate oxide film 23a of transistor region 15 (see FIG. 3).

After this, a resist is applied over the entire surface of substrate 11 so as to cover capacitative section region 17 and transistor section region 15, a resist pattern 61 being formed that exposes at least the upper surface of island-shaped WSi$_x$ layer 27a of capacitative section region 17 and substrate region 11a in the vicinity of gate electrode 31 of transistor section region 15 (see FIG. 5). The aperture for exposing the upper surface of this WSi$_x$ layer 27a is shown at 60a. Also, the aperture for exposing region 11a is shown at 60b. Then, using this resist pattern 61 as a mask for ion implantation, phosphorus is doped to substrate 11 from above this mask 61 (see FIG. 5). Preferably the implantation of these phosphorus ions is performed with an acceleration energy of 20–40 keV and a dose of $1 \times 10^{16}$ ion/cm$^2$.

As a result, phosphorus can be introduced into WSi$_x$ layer 27a of upper electrode 29 and second polysilicon layer 25a below this WSi$_x$ 27a. The benefits of this are as described in the fourth embodiment.

Also, the process of LDD construction of an NMOS transistor in the step of forming the transistor section, which involves the introduction of phosphorus impurity into the region 11a of the substrate surrounding the gate electrode 31 can be performed. The number of process steps can thereby be reduced compared with the prior art.

Sixth Embodiment

A sixth embodiment is described with reference to FIG. 6 for an example in which doping of phosphorus into a metallic layer of a stacked layer structure as described in the third embodiment is performed preferentially in the region of the upper surface of the metallic layer that is located directly above the island-shaped lower electrode layer and dielectric layer.

Figure 6:
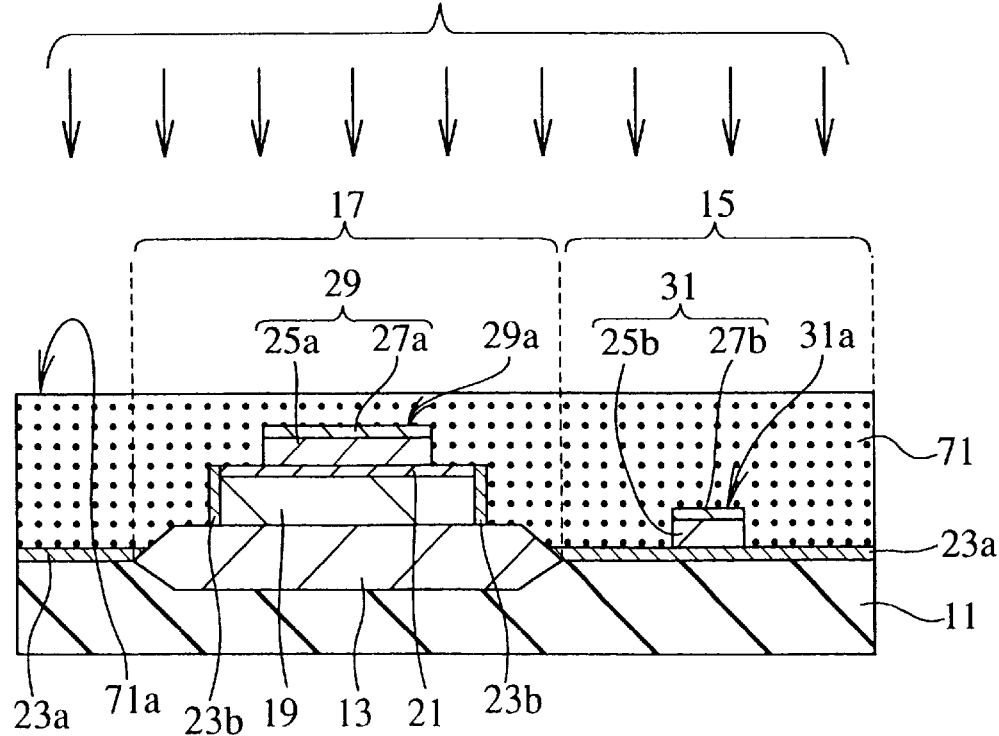
FIG. 6 is a cross-sectional view given in explanation of a sixth embodiment of a method of forming according to the present invention.
Figure 7A:
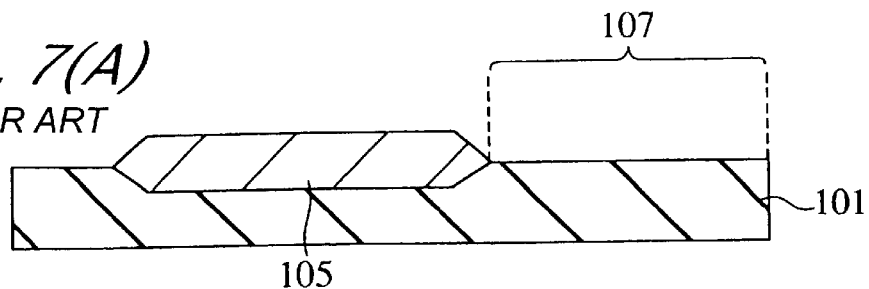
FIGS. 7A–7E are cross-sectional views given in explanation of prior art.
Figure 7B:
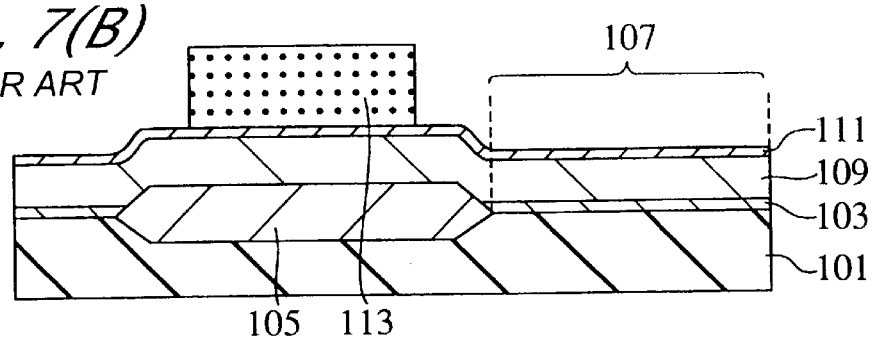
Figure 7C:
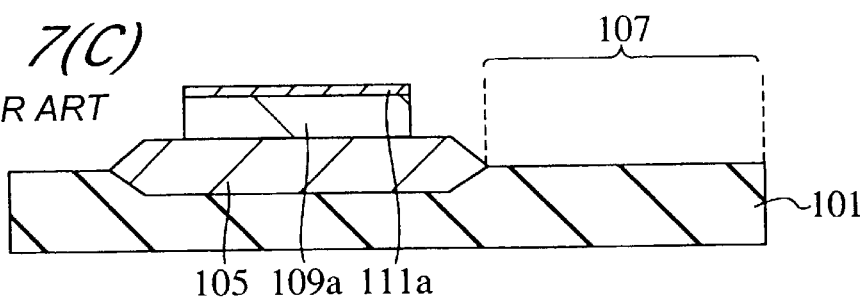
Figure 7D:
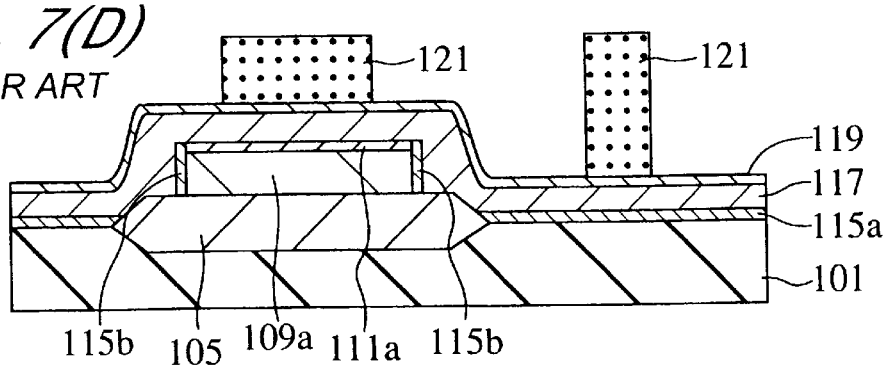
Figure 7E:
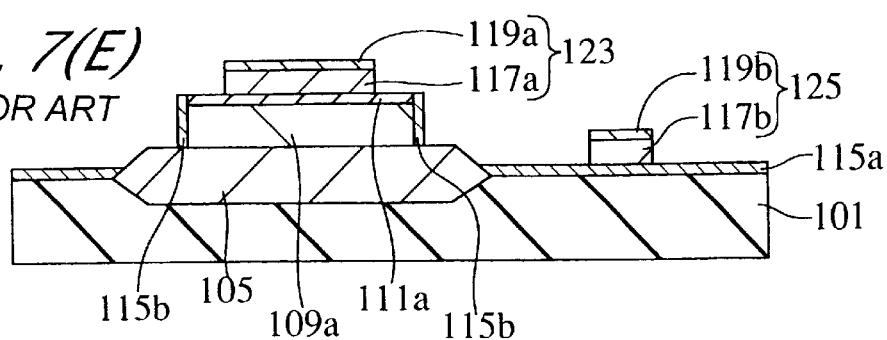

FIG. 6 is a diagrammatic cross-sectional view of a construction during the process of forming the vicinity of a capacitative section of a semiconductor device according to this embodiment.

Aspects which differ from the first to the fifth embodiments are described below, but description of aspects which are the same is omitted.

Just as in the case of the first embodiment, a stacked layer structure is formed by forming in capacitative section region 17 of substrate 11 an island-shaped lower electrode layer 19 constituted by a first polysilicon layer and a dielectric layer 21 constituted by an $SiO_2$ layer, forming over the entire upper surface of substrate 11 so as to cover this lower electrode layer 19 and dielectric layer 21 an impurity-doped layer 25 constituting a second polysilicon layer, and providing over this second polysilicon layer 25 a metallic layer 27 constituted by a tungsten silicide layer ($WSi_x$ layer) (see FIG. 1(A)).

After this, just as in the third embodiment, using a photolithography/etching step, an upper electrode layer 29 is constituted by forming in island shape a second polysilicon layer 25a and $WSi_x$ layer 27a on island-shaped dielectric layer 21. Also, in the same photolithography/etching step, gate electrode 31 consisting of island-shaped second polysilicon layer 25b and $WSi_x$ layer 27b is formed on gate oxide film 23a of transistor region 15 (see FIG. 3).

After this, over the entire surface of substrate 11, a protective layer 71 is formed such as to cover capacitative section region 17 and transistor section region 15. $O_3$-PSG film, which is of excellent flatness, may be employed for this protective layer 71. Flatness of upper surface 71a of this protective layer 71 may be further improved by etch-back treatment. After this, the entire upper surface 71a of protective layer 71 is doped with phosphorus by ion implantation from above protective layer 71. This phosphorus ion implantation is performed under energy conditions in the range: acceleration energy of 20–40 keV. This ion implantation is performed with lower energy than the conditions that are normally used in an ion implantation step in order that the phosphorus ions may reach the upper surface 29a of upper electrode layer 29 but not reach gate electrode 31 (see FIG. 6).

Comparing the thickness of protective layer 71 from the upper surface 71a of the protective layer to the upper surface 29a of upper electrode layer 29 of the capacitative section with the thickness of protective layer 71 from the upper surface 71a of the protective layer to the upper surface 31a of gate electrode 31, there is a difference of at least 4000 Å (0.40 $\mu$m). This is because, in the capacitative section, the thickness from the upper surface of substrate 11 to the upper surface of dielectric layer 21 where upper electrode layer 29 is provided is at least 4400 Å (0.44 $\mu$m) (since the thickness from the upper face of substrate 11 to the upper face of field oxide film 13 is 1000–1300 Å, the thickness of lower electrode layer 19 is 3000 Å and the thickness of dielectric layer 21 is 400 Å.). As a result, the thickness of protective layer 71 as far as the upper face 29a of the upper electrode layer is thinner than the thickness of protective layer 71 as far as the upper face 31a of the gate electrode. Consequently, when ion implantation is performed under low energy conditions, the ions are able to penetrate through protective layer 71 as far as upper surface 29a of the upper electrode layer but are completely unable to penetrate as far as gate electrode 31. Phosphorus can therefore be selectively introduced into $WSi_x$ layer 27a of upper electrode layer 29.

By this means, a desired capacitative section and gate section are obtained. The benefits of being able to selectively introduce phosphorus into the $WSi_x$ layer of the upper electrode layer are as in the fourth embodiment.

Also, by the use of a protective layer as in this embodiment, selective doping of phosphorus into the $WSi_x$ layer of the capacitative section can be achieved whilst more easily protecting the transistor section from phosphorus.

As is apparent from the above description, a capacitative section of a semiconductor device according to the present invention is formed by a step of forming a stacked layer structure consisting of: a lower electrode provided on the substrate and constituting a first polysilicon layer, a dielectric layer provided on this lower electrode layer and constituting an $SiO_2$ layer, and an upper electrode layer consisting of a second polysilicon layer constituting an impurity-doped layer and a tungsten silicide layer ($WSi_x$ layer) constituting a metallic layer provided in sequence on this dielectric layer; and a step of doping the $WSi_x$ layer with phosphorus, which is the impurity in the second polysilicon layer, before heat treatment of the stacked layer structure.

By raising the phosphorus concentration in the $WSi_x$ layer and the second polysilicon layer therebelow by doping the $WSi_x$ layer with phosphorus, the phosphorus concentrations of the first polysilicon layer and second polysilicon layer can be made the same. Also, even though heat treatment is performed subsequently, diffusion of phosphorus from the second polysilicon layer into the $WSi_x$ layer can be prevented. Consequently, there is no possibility of a difference in phosphorus concentration being produced between the lower electrode layer (first polysilicon layer) and upper electrode layer (second polysilicon layer). Consequently, the capacitance characteristic of the capacitative section does not depend on voltage and a desired characteristic is obtained. Also, there is no possibility of impairing the adhesion between the second polysilicon layer and the $WSi_x$ layer, since this $WSi_x$ layer is doped with phosphorus after formation of the $WSi_x$ layer on the second polysilicon layer.

Also, since the upper electrode layer of the capacitative section can be formed of the material of the gate electrode of the transistor section, this upper electrode layer and gate electrode can be formed in the same step. The present invention can be applied when the capacitative section and gate section of the transistor are formed in the same step in this way.

When doping of phosphorus into the upper electrode layer of the capacitative section is performed, the transistor region may be protected by employing a resist pattern as a mask in order that phosphorus doping cannot reach the transistor region. Also, although in the embodiments described above, it is possible that phosphorus doping may reach the $WSi_x$ layer of the gate electrode, if the fluctuation of the characteristic resulting from phosphorus doping into the gate is within the range of fluctuation resulting from error of the transistor characteristic, such an occurrence does not give rise to problems.

Also, the LDD structure of an NMOS transistor can be formed by doping of phosphorus into the substrate region peripheral to the gate electrode of the transistor by utilising a step of doping phosphorus into the upper electrode layer of the capacitative section.

Also, if a thick protective layer is formed covering the capacitative section and gate section and doping of phosphorus is performed from above this protective layer after flattening the upper surface of this protective layer, the thickness of the protective layer is different in the capacitative section and the gate section, being thinner in the capacitative section, so phosphorus can be selectively implanted in the upper electrode layer of the capacitative section. In this way, doping of phosphorus into the upper electrode layer of the capacitative section can be achieved more easily.

Also, the material of the dielectric film of the capacitative section is not restricted to $SiO_2$ and $Si_3N_4$ etc. could be used. Also, the metallic layer is not restricted to being tungsten silicide and a metallic material such as Al etc. could be employed.

Also, although in the embodiments described above examples were described in which phosphorus was employed as the impurity, the same effect could be obtained by using arsenic (As) instead of phosphorus. In the case of As, an impurity concentration of $6 \times 10^{20}$ ion/cm$^3$ is suitable.

What is claimed is:

1. A method of forming a capacitative section of a semiconductor device comprising:

forming a stacked layer structure including a lower electrode layer having a first impurity concentration provided on an underlay, a dielectric layer provided on said lower electrode layer, and an upper electrode layer comprising an impurity-doped layer having a second impurity concentration which is lower than the first impurity concentration and a metallic layer arranged in sequence on said dielectric layer; and doping said metallic layer with a same impurity as an impurity in said impurity-doped layer prior to heat treatment of said stacked layer structure, to raise the second impurity concentration to a same level as the first impurity concentration and provide an equilibrium condition between an impurity concentration of said metallic layer and the impurity concentration of the impurity-doped layer.

2. The method of forming a capacitative section of a semiconductor device according to claim 1, wherein said forming a stacked layer structure comprises:

forming an island-shaped lower electrode layer and said dielectric layer on the underlay;

forming said impurity-doped layer as covering said dielectric layer and the underlay; and forming a metallic layer on said impurity-doped layer.

3. The method of forming a capacitative section of a semiconductor device according to claim 1, wherein said doping of said metallic layer comprises doping the impurity into said metallic layer over an entire surface of said metallic layer.

4. The method of forming a capacitative section of a semiconductor device according to claim 2, wherein said doping of said metallic layer comprises doping the impurity into said metallic layer in a region of an upper surface of said metallic layer located directly above said island-shaped lower electrode layer and said dielectric layer.

5. The method of forming a capacitative section of a semiconductor device according to claim 1, wherein the impurity is phosphorus.

6. The method of forming a capacitative section of a semiconductor device according to claim 1, wherein said dielectric layer is an $SiO_2$ layer, said lower electrode layer and said impurity-doped layer are polysilicon layers, said metallic layer is tungsten silicide having a composition ratio of silicide in a range between 2.2 and 2.5, and the impurity is phosphorus.

7. A method of forming a capacitative section and a gate section of a semiconductor device comprising:

forming a stacked layer structure consisting of
        a lower electrode layer having a first impurity concentration provided on an underlay, a dielectric layer provided on said lower electrode layer, and an upper electrode layer comprising a first impurity-doped layer having a second impurity concentration which is lower than the first impurity concentration and a first metallic layer arranged in sequence on said dielectric layer, and
        a gate electrode comprising an island-shaped second impurity-doped layer and a second metallic layer arranged on said underlay separated from said stacked layer structure; and doping at least the first metallic layer with a same impurity as an impurity in said first impurity-doped layer prior to heat treatment of said stacked layer structure, to raise the second impurity concentration to a same level as the first impurity concentration and provide an equilibrium condition between an impurity concentration of said first metallic layer and the impurity concentration of the first impurity-doped layer.

8. The method of forming a capacitative section and a gate section of a semiconductor device according to claim 7, wherein a mask is formed on said stacked layer structure and said underlay, and doping of the impurity into an exposed portion of said first metallic layer is performed from above through said mask.

9. The method of forming a capacitative section and a gate section of a semiconductor device according to claim 7, wherein said doping of at least the first metallic layer comprises doping the impurity in a region around said first metallic layer and said gate electrode.

10. The method of forming a capacitative section and a gate section of a semiconductor device according to claim 7, wherein said doping of at least the first metallic layer comprises:

forming a protective layer on said underlay and covering said stacked layer structure and said gate electrode, and flattening an upper surface of said protective layer; and ion implanting the impurity from said upper surface of the protective layer towards said underlay.

11. The method of forming a capacitative section and a gate section of a semiconductor device according to claim 7, wherein said lower electrode layer, said first impurity-doped layer and said second impurity-doped layer are polysilicon layers, said dielectric layer is an $SiO_2$ layer, said first metallic layer and said second metallic layer are tungsten silicide layers, and the impurity is phosphorus.

12. A method of forming a semiconductor device comprising:

forming a lower electrode layer having a first impurity concentration on a surface of a substrate;

forming a dielectric layer on the lower electrode layer;

forming an impurity-doped layer on the dielectric layer, the impurity-doped layer having a second impurity concentration lower than the first impurity concentration;

forming a metallic layer on the impurity-doped layer, the impurity-doped layer and the metallic layer being an upper electrode layer; and doping the metallic layer with a same impurity as the impurity-doped layer prior to heat treatment, to provide on equilibrium condition between an impurity concentration of the metallic layer and the impurity concentration of the impurity-doped layer.

13. The method of forming a semiconductor device of claim 12, wherein the lower electrode, the dielectric layer, the impurity-doped layer and the metallic layer are formed in a first area of the surface of the substrate as a capacitor, and the impurity-doped layer and the metallic layer are formed in a second area of the surface of the substrate as a gate electrode.

14. The method of forming a semiconductor device of claim 13, wherein said doping comprises doping the metallic layer using a mask having an aperture aligned only with the metallic layer of the capacitor.

15. The method of forming a semiconductor device of claim 13, wherein said doping comprises doping the metallic layer using a mask having apertures aligned only with the metallic layer of the capacitor, the mask also having apertures aligned with portions of the substrate adjacent the gate electrode.

16. The method of forming a semiconductor device of claim 13, wherein said doping comprises:

forming a protective layer on the surface of the substrate including the capacitor and the gate electrode in the first and second areas;

flattening an upper surface of the protective layer; and implanting the impurity from the upper surface of the flattened protective layer toward the surface of the substrate.

17. The method of forming a semiconductor device of claim 12, wherein the lower electrode layer and the impurity-doped layer are polysilicon layers, the dielectric layer is silicon dioxide, the metallic layer is tungsten silicide and the impurity is phosphorus.

18. The method of forming a semiconductor device of claim 17, wherein a composition ratio of silicide in the metallic layer is in a range between 2.2 and 2.5.

19. The method of forming a semiconductor device of claim 12, wherein said doping raises the second impurity concentration to a same level as the first impurity concentration.

* * * * *